(12) United States Patent
Horiuchi

(10) Patent No.: US 11,972,835 B2
(45) Date of Patent: Apr. 30, 2024

(54) LATCH CIRCUIT DEVICE AND PORT SAMPLING SYSTEM

(71) Applicant: DENSO TEN Limited, Kobe (JP)

(72) Inventor: Kazuo Horiuchi, Kobe (JP)

(73) Assignee: DENSO TEN Limited, Kobe (JP)

( * ) Notice: Subject to any disclaimer, the term of this patent is extended or adjusted under 35 U.S.C. 154(b) by 187 days.

(21) Appl. No.: 17/582,705

(22) Filed: Jan. 24, 2022

(65) Prior Publication Data

US 2023/0059694 A1 Feb. 23, 2023

(30) Foreign Application Priority Data

Aug. 23, 2021 (JP) ................................. 2021-135347

(51) Int. Cl.
*G11C 7/10* (2006.01)
(52) U.S. Cl.
CPC .............. *G11C 7/109* (2013.01); *G11C 7/106* (2013.01); *G11C 7/1069* (2013.01); *G11C 7/1087* (2013.01)
(58) Field of Classification Search
CPC ..... G11C 7/106; G11C 7/1087; G11C 7/1069; G11C 7/109
See application file for complete search history.

(56) References Cited

U.S. PATENT DOCUMENTS

| 2004/0122565 A1* | 6/2004 | Sakurai | F02D 41/26 701/1 |
| 2012/0054526 A1* | 3/2012 | Sugitachi | F02P 3/0892 713/340 |
| 2016/0224398 A1* | 8/2016 | Palmer | G06F 9/542 |
| 2020/0301497 A1* | 9/2020 | Li | G07C 9/00174 |

FOREIGN PATENT DOCUMENTS

JP 2010-171927 A 8/2010

* cited by examiner

*Primary Examiner* — Zachary K Huson
(74) *Attorney, Agent, or Firm* — Oliff PLC

(57) ABSTRACT

A latch circuit device includes: a latch circuit configured to latch an input signal to a microcomputer; a detection circuit configured to detect that the input signal is input to the latch circuit during a sleep period in which the microcomputer is in a sleep state; a wake-up circuit configured to transmit a wake-up signal to the microcomputer when an input of the input signal is detected during the sleep period; a sampling circuit configured to read the input signal from the latch circuit; a transmission circuit configured to transmit the input signal read by the sampling circuit to the microcomputer returned from the sleep state based on the wake-up signal; and a release circuit configured to release a latch state of the latch circuit after the input signal is read.

5 Claims, 3 Drawing Sheets

LATCH CIRCUIT DEVICE AND PORT SAMPLING SYSTEM

CROSS-REFERENCE TO RELATED APPLICATION

This application is based on and claims priority under 35 USC 119 from Japanese Patent Application No. 2021-135347 filed on Aug. 23, 2021.

TECHNICAL FIELD

The present invention relates to a latch circuit device and a port sampling system.

BACKGROUND ART

JP-A-2010-171927 discloses a device in which an output level of an output port is periodically changed by a CPU based on a sampling period set in a register, and when a data latch unit latches data given to an input port based on a timing signal starting from a change in the output level, the latched data is stored in a data register.

SUMMARY OF INVENTION

For example, in a microcomputer used in an in-vehicle device, the number of input signals tends to increase as the in-vehicle device becomes multifunctional. However, the number of input ports of the microcomputer is limited, and there is a problem that it is not always possible to input all required signals. Therefore, the plurality of input signals may be parallel-serial converted and input to the microcomputer via a serial communication path, but in a case of inputting signals to the microcomputer in a sleep state, there is a problem that values of the input signals may change during a period from when the microcomputer is returned from the sleep state to when the input signals are converted and input to the microcomputer, and the signals may not be appropriately input.

The present invention is to provide a technique capable of, when a plurality of input signals are input to a microcomputer, reducing the number of input ports to be occupied due to the input and inputting a signal generated during sleep of the microcomputer after wake-up.

An aspect of the present invention is a latch circuit device including: a latch circuit configured to latch an input signal to a microcomputer; a detection circuit configured to detect that the input signal is input to the latch circuit during a sleep period in which the microcomputer is in a sleep state; a wake-up circuit configured to transmit a wake-up signal to the microcomputer when an input of the input signal is detected during the sleep period; a sampling circuit configured to read the input signal from the latch circuit; a transmission circuit configured to transmit the input signal read by the sampling circuit to the microcomputer returned from the sleep state based on the wake-up signal; and a release circuit configured to release a latch state of the latch circuit after the input signal is read.

According to the present invention, it is possible to provide a technique capable of, when a plurality of input signals are input to a microcomputer, reducing the number of input ports to be occupied due to the input and inputting a signal generated during sleep of the microcomputer after wake-up.

DESCRIPTION OF EMBODIMENTS

Hereinafter, an embodiment of the present invention will be described with reference to the drawings. A configuration of the following embodiment is an example, and the present invention is not limited to the configuration of the embodiment.

Figure 1:
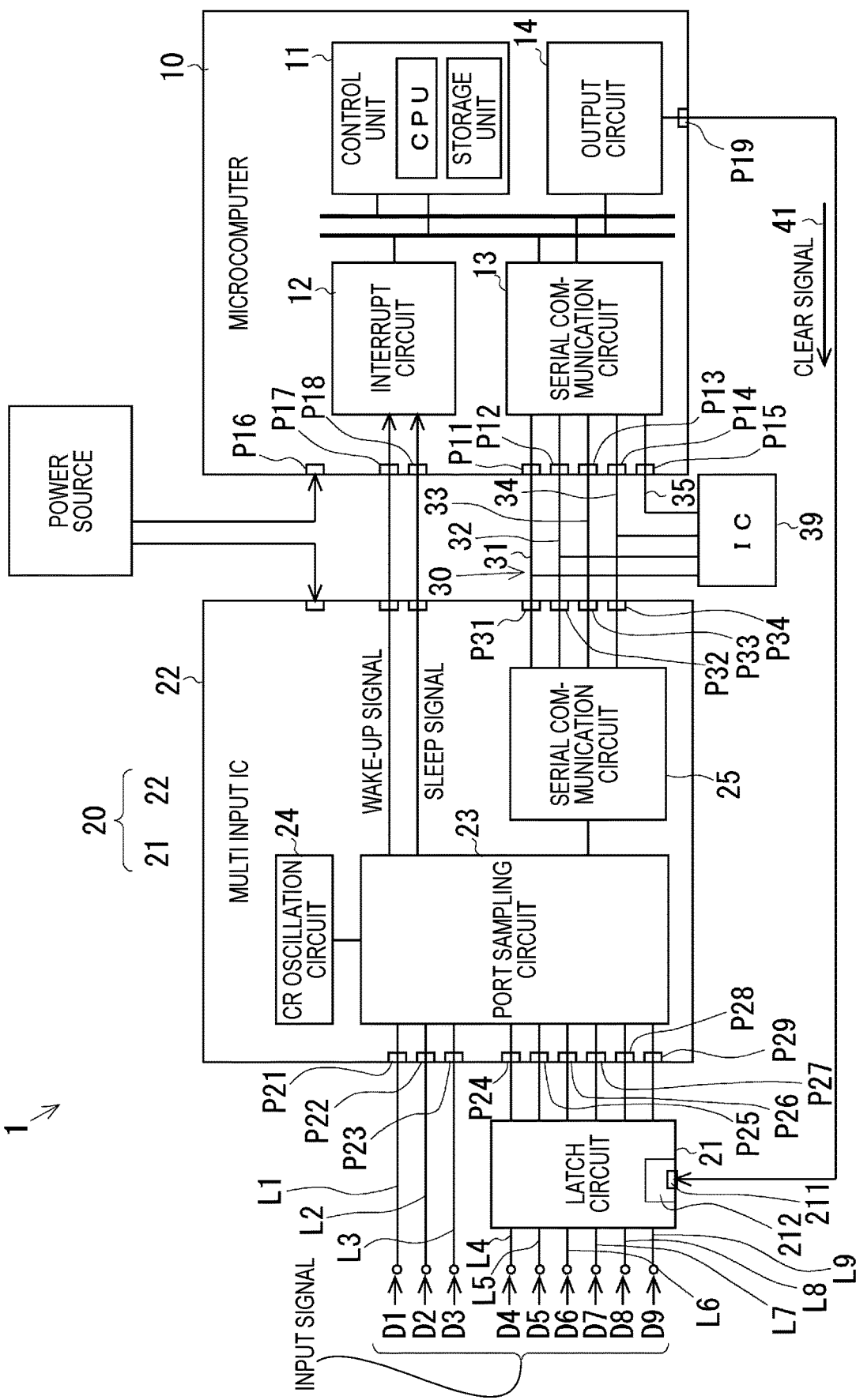
FIG. 1 is a diagram illustrating a configuration of a port sampling system.

FIG. 1 is a diagram illustrating a configuration of a port sampling system 1. The port sampling system 1 of the present embodiment includes a microcomputer 10 and a latch circuit device 20 that latches an input signal to the microcomputer 10 and transmits the latched input signal to the microcomputer 10. The latch circuit device 20 includes a latch circuit 21 and a multi-input IC 22. The port sampling system 1 may include a power source or may be configured to receive power supply from an external power source. The port sampling system 1 of the present embodiment is used in an in-vehicle device, receives power supply from a battery on a vehicle side, and receives an input signal from an electronic control unit (ECU). The port sampling system 1 is not limited to a system used in the in-vehicle device.

<Microcomputer>

The microcomputer 10 includes a control unit 11, an interrupt circuit 12, a serial communication circuit 13, an output circuit 14, and ports P11 to P19. The microcomputer 10 is a so-called one-chip microcomputer in which these components are provided in one IC.

The control unit 11 is configured with a processor and a storage unit, and integrally executes various types of arithmetic processing in the microcomputer 10. The processor is an arithmetic processing unit such as a central processing unit (CPU), a digital signal processor (DSP), or a field-programmable gate array (FPGA). The storage unit is, for example, a random access memory (RAM) or a read only memory (ROM), and is used as a main storage unit or an auxiliary storage unit.

The control unit 11 periodically transmits a read request of the input signal to the latch circuit device 20 via the serial communication circuit 13. The control unit 11 acquires the input signal read in response to the read request from the multi-input IC 22 via the serial communication circuit 13, and executes processing corresponding to the input signal. Further, the control unit 11 performs processing for causing the microcomputer 10 to shift to a normal state or a sleep state in response to an interrupt signal such as a wake-up signal or a sleep signal. The control unit 11 may comprehensively determine the shift to the sleep state based on the latch circuit device 20 or other input signals thereof and perform processing for causing the microcomputer 10 to shift.

When the interrupt circuit 12 receives the interrupt signal, the interrupt circuit 12 inputs the interrupt signal to the control unit 11. For example, when the interrupt circuit 12 receives the wake-up signal as the interrupt signal, the control unit 11 is notified of this situation, and wake-up processing for causing the microcomputer 10 to transmit from the sleep state to the normal state is performed. When the interrupt circuit 12 receives the sleep signal as the interrupt signal, the control unit 11 is notified of this situation, and sleep processing for causing the microcomputer 10 to transmit from the normal state to the sleep state is performed. The interrupt circuit 12 monitors the interrupt signal even during sleep. When the interrupt circuit 12 receives the wake-up signal, the interrupt circuit 12 may operate a relay for power supply to start power supply to each functional unit such as the control unit 11, the serial communication circuit 13, and the output circuit 14. Further, when the sleep processing by the control unit 11 is completed, the interrupt circuit 12 may open a relay for power supply to stop the power supply to each functional unit such as the control unit 11, the serial communication circuit 13, and the output circuit 14.

The serial communication circuit 13 performs serial communication with the multi-input IC 22 of the latch circuit device 20. The serial communication circuit 13 is a form of a reception circuit that receives the input signal from the multi-input IC 22 or a transmission circuit that transmits a signal to the multi-input IC 22.

The output circuit 14 is a circuit that outputs a signal to an external device. For example, when the microcomputer 10 receives the input signal from the multi-input IC 22, the microcomputer 10 transmits a latch clear signal (release signal) to the latch circuit 21 to release a latch state thereof.

The ports P11 to P19 are terminals that are connected to external signal lines and input a signal into the microcomputer or output a signal from the microcomputer to the outside.

<Latch Circuit Device>

A plurality of input signals D1 to D9 for the microcomputer 10 are input to the latch circuit device 20 from another device such as an ECU. The input signals D4 to D9 among these input signals are signals (hereinafter, also referred to as wake-up target signals) that transmit wake-up signals to wake up the microcomputer 10 in a case where these signals are input when the microcomputer 10 is in the sleep state. In FIG. 1, the input signals D1 to D3 are directly input to input ports P21 to P23 of the multi-input IC 22 via signal lines L1 to L3. On the other hand, the input signals D4 to D9 are input to the latch circuit 21 via signal lines L4 to L9, and are input from the latch circuit 21 to ports P24 to P29 of the multi-input IC 22.

The latch circuit 21 is a circuit that holds an input signal when the input signal is input, and holds a Hi state, for example, when a state in which the input signal is not input is Lo and the state becomes Hi due to the input of the input signal. The latch circuit 21 may be configured to hold the Lo state when the state in which the input signal is not input is Hi and the state becomes Lo due to the input of the input signal. The latch circuit 21 is, for example, a flip-flop. Further, the latch circuit 21 includes a clear terminal 211, the clear terminal 211 is connected to the output port P19 of the microcomputer 10, and transmits a clear signal to the latch circuit 21 when the microcomputer 10 completes the reception of the input signal. The latch circuit 21 includes a release circuit 212 that releases the latch state of the latch circuit 21 when the clear terminal 211 receives a clear signal from the output port P19 of the microcomputer 10 and brings the latch circuit 21 into a state (initial state) in which the input signal is not input.

The multi-input IC 22 includes a port sampling circuit 23, a CR oscillation circuit 24, a serial communication circuit 25, the ports P21 to P29, and ports P31 to P34.

The port sampling circuit 23 reads the input signals D1 to D9 in response to the read request. The port sampling circuit 23 reads the input signals D1 to D9 at a timing based on the clock signal generated by the CR oscillation circuit 24. Since the microcomputer 10 periodically transmits the read request to the multi-input IC 22 via the serial communication circuit 13, the port sampling circuit 23 periodically reads the input signals D1 to D9.

The port sampling circuit 23 detects that the input signals D4 to D9 are input to the latch circuit 21 during a sleep period in which the microcomputer 10 is in the sleep state. That is, the port sampling circuit 23 of the present embodiment is a form of a detection circuit. Further, when the input of the input signals D4 to D9 is detected during the sleep period, the port sampling circuit 23 transmits the wake-up signal to the microcomputer 10. That is, the port sampling circuit 23 is a form of a wake-up circuit.

The serial communication circuit 25 transmits the input signal read by the port sampling circuit 23 to the microcomputer 10. When the input signal is input during the sleep period of the microcomputer 10, the microcomputer 10 performs the wake-up processing in response to the wake-up signal and transmits the wake-up signal to the microcomputer 10 that returned from the sleep state. The serial communication circuit 25 of the present embodiment is a form of a transmission circuit.

The serial communication circuit 25 of the multi-input IC 22 and the serial communication circuit 13 of the microcomputer 10 are connected by a serial communication line 30. The serial communication line 30 has communication lines 31 to 35, one ends of the communication lines 31 to 34 are connected to the ports P11 to P14 of the microcomputer 10, and the other ends are connected to the ports P31 to P34 of the multi-input IC 22. A clock signal for synchronizing communication is transmitted from the microcomputer 10 through the communication line 31. The communication line 32 is a line through which the microcomputer 10 transmits data, that is, a line through which the multi-input IC 22 receives data. The communication line 33 is a line through which the multi-input IC 22 transmits data, that is, a line through which the microcomputer 10 receives data. The communication line 34 is a line through which the microcomputer 10 transmits a chip selection signal to indicate a communication partner.

As described above, in the present embodiment, the four communication lines 31 to 34 are used for serial communication between the microcomputer 10 and the multi-input IC 22, but the present invention is not limited to this configuration. For example, a part of the communication lines 31 to 34 may be omitted. One end of the communication line 35 is connected to the port P15 of the microcomputer 10, and the other end of the communication line 35 is connected to another IC chip 39. The communication lines 31 to 33 are also connected to the IC chip 39, and are shared by the IC chip 39 and the multi-input IC 22. The communication line 35 is a line (communication line for selection) that transmits the chip selection signal when the microcomputer 10 communicates with the IC chip 39. In this way, when communicating with an IC chip other than the multi-input IC 22, the communication lines 31 to 33 may be shared, and the same number of communication lines for selection as the number of IC chips may be added. For example, the microcomputer 10 transmits the chip selection signal to a communication line for selection of a communication partner, and the IC chip receiving the chip selection signal communicates with the microcomputer 10 using the communication lines 31 to 33.

Figure 2:
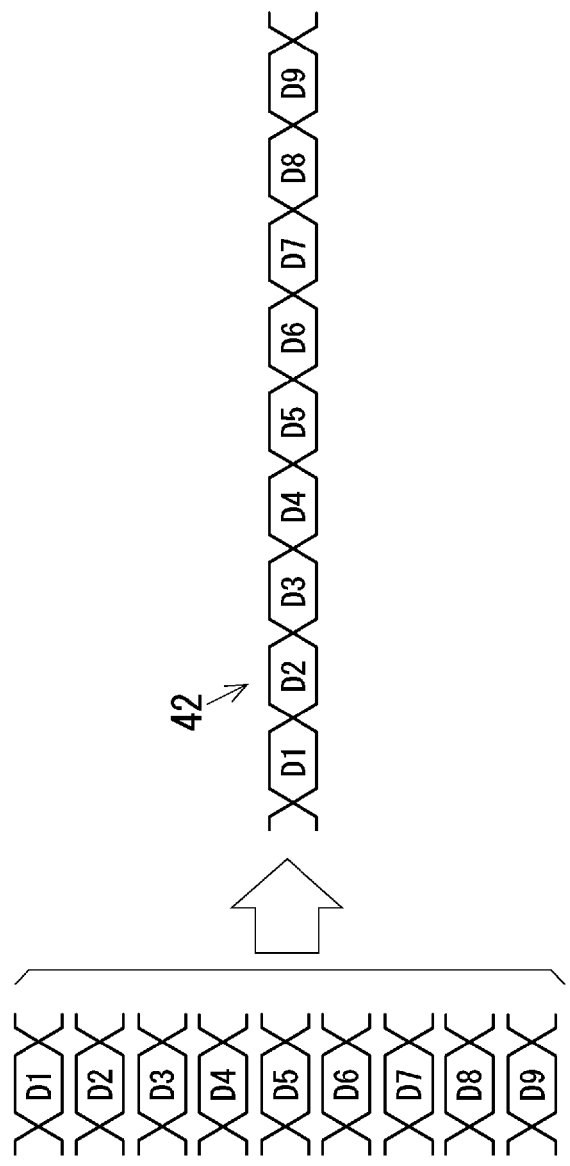
FIG. 2 is an illustrative diagram of processing of parallel-serial conversion of an input signal.

The serial communication circuit 25 performs parallel-serial conversion on the input signals read through the input ports P21 to P29. FIG. 2 is an illustrative diagram of processing of the parallel-to-serial conversion of the input signals. As illustrated in FIG. 2, the serial communication circuit 25 serially arranges the input signals D1 to D9 read in parallel from the input ports P21 to P29 in a predetermined order to form a serial signal 42. The parallel-serial conversion is performed. The read input signals are converted into the serial signal, and the converted serial signal is transmitted to the microcomputer 10 via the communication line 33. Accordingly, nine types of input signals can be input to one input port via one communication line 33, and the number of input ports occupied when a plurality of input signals are transmitted can be reduced.

<Operation>

Figure 3:
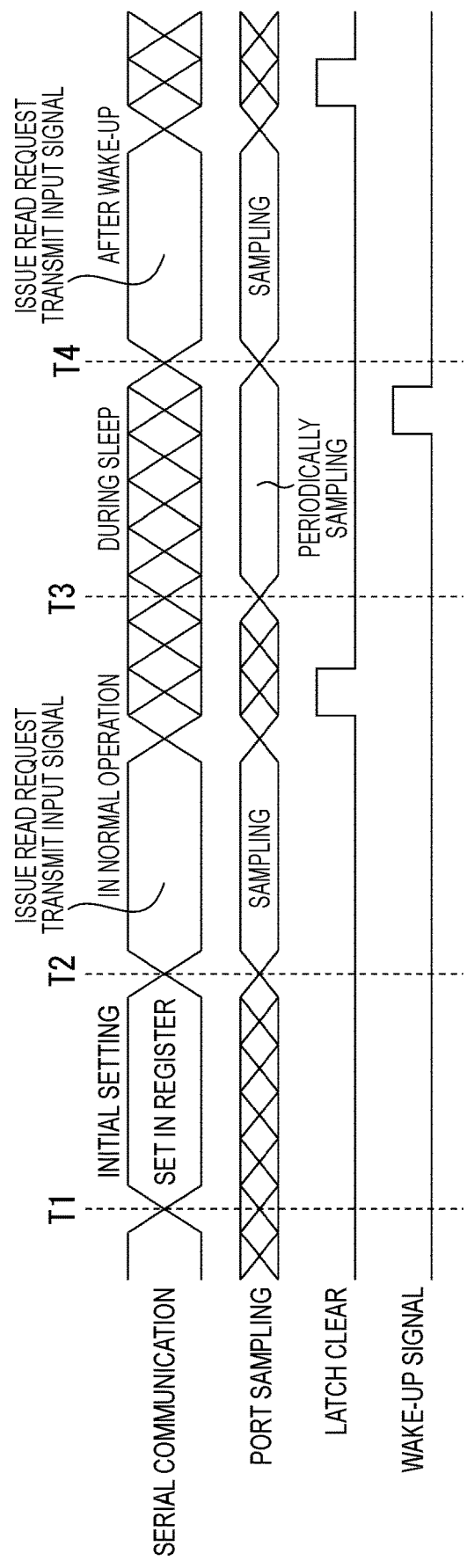
FIG. 3 is a time chart illustrating timings of serial communication, port sampling, latch clear, and a wake-up signal in the port sampling system.

FIG. 3 is a time chart illustrating timings of serial communication, port sampling, latch clear, and the wake-up signal in the port sampling system 1. In FIG. 3, a horizontal axis represents passage of time. In FIG. 3, a timing T1 is a time when the power source is connected to the port sampling system 1. For example, the timing at which an in-vehicle device including the latch circuit device 20 and the microcomputer 10 of the port sampling system 1 is mounted on a vehicle and the in-vehicle device is connected to a battery on a vehicle side is T1. By the connection of the power source, the latch circuit device 20 and the microcomputer 10 perform initial setting. For example, setting information, such as which port among the ports P24 to P29 of the multi-input IC 22 receives an input to wake up the microcomputer 10, whether an edge at which the input signals D4 to D9 are changed from Lo to Hi is set as an effective edge or whether an edge at which the input signals D4 to D9 are changed from Hi to Lo is set as an effective edge, or which state of the input signals D1 to D9 enables the microcomputer 10 to shift to the sleep state, is set in the register.

After a timing T2 at which the initial setting ends, the latch circuit device 20 and the microcomputer 10 perform a normal operation. For example, the microcomputer 10 issues the read request to the multi-input IC 22 via the serial communication circuit 13. The multi-input IC 22 that received the read request reads (samples) the input signals input to the input ports P21 to P29, and transmits the read input signals to the microcomputer 10 via the serial communication circuit 25. When the reception of the input signal is completed, the microcomputer 10 transmits a clear signal 41 from the output port P19 to the clear terminal 211 of the latch circuit 21. The latch circuit 21 that received the clear signal 41 clears the state of the latched input signal. The processing from the read request to the clearing of the latch circuit 21 is repeated at a predetermined cycle while the microcomputer 10 is in the normal state, that is, until the microcomputer 10 becomes the sleep state.

When the microcomputer 10 enters the sleep state (T3), the microcomputer 10 does not perform the normal operation such as the serial communication, and the multi-input IC 22 periodically reads (samples) the input signals input to the input ports P21 to P29. Then, the multi-input IC 22 transmits the wake-up signal to the microcomputer 10 when the read input signal satisfies a wake-up condition, for example, when any one of the wake-up target signals is input.

When the microcomputer 10 that received the wake-up signal performs the wake-up processing and wakes up (T4), the microcomputer 10 and the latch circuit device 20 perform the processing from the read request to the clearing of the latch circuit 21 in a similar manner as in the normal operation.

Effects of Embodiment

As described above, in the port sampling system 1 of the present embodiment, when the input signal is input and latched in the latch circuit 21 during the sleep period of the microcomputer 10, the wake-up signal is transmitted to the microcomputer 10 to cause the microcomputer 10 to wake up, and the latched input signal is transmitted to the microcomputer 10 after the wake-up.

Accordingly, the port sampling system 1 of the present embodiment can appropriately transmit the input signal input during the sleep period of the microcomputer 10 to the microcomputer 10.

The port sampling system 1 of the present embodiment converts the plurality of input signals read from the latch circuit 21 into the serial signal, and transmits the serial signal to the microcomputer 10 via the serial communication line 30. Accordingly, the port sampling system 1 of the present embodiment can reduce the number of input ports to be occupied even when a large number of input signals are input to the microcomputer 10. For example, in the present embodiment, serial communication is performed by the four communication lines 31 to 34, and nine input signals (six of them are wake-up target signals) can be transmitted using the ports P11 to P14 of the microcomputer 10, and the number of the ports P11 to P14 used is reduced to five. Further, in the port sampling system 1 of the present embodiment, the multi-input IC 22 shares the serial communication lines 31 to 34 with other IC chips, and the port P14 of the microcomputer 10 occupied for transmission of the input signals is substantially one, and the number of input ports occupied can be effectively suppressed.

In the port sampling system 1 of the present embodiment, when the microcomputer 10 is in the normal state, the port sampling circuit 23 periodically receives the read request signal from the microcomputer 10, reads the input signal from the latch circuit in response to the read request signal, and transmits the read input signal to the microcomputer 10. After the input signal is received by the microcomputer 10, the release circuit releases the latch state of the latch circuit. Accordingly, the port sampling system 1 of the present embodiment can transmit the input signal to the microcomputer 10 even in the normal state in a similar manner as during the sleep period described above, and can reduce the number of input ports to be occupied even when a large number of input signals are input to the microcomputer 10.

In the port sampling system 1 of the present embodiment, when the release circuit 212 of the latch circuit 21 receives the release signal 41 from the microcomputer 10 that has received the input signal, the latch state of the latch circuit 21 is released. Accordingly, it is possible to repeatedly and continuously perform processing of temporarily latching the wake-up target signals and inputting the wake-up target signals to the microcomputer 10.

Although the embodiment of the present invention has been described above, this embodiment is merely an example, the present invention is not limited thereto, and various modifications based on the knowledge of those skilled in the art can be made without departing from the gist of the claims.

REFERENCE SIGNS LIST

1 port sampling system
10 microcomputer
11 control unit
12 interrupt circuit
13 serial communication circuit
14 output circuit
15 port
20 latch circuit device 21 latch circuit
23 port sampling circuit
24 CR oscillation circuit
25 serial communication circuit
30 serial communication circuit
31 to 35 communication line
41 clear signal
42 serial signal
211 clear terminal
212 release circuit
D1 to D9 input signal
22 multi-input IC
L1 to L9 signal line
P11 to P19 port
P21 to P29 port
P31 to P34 port

What is claimed is:

1. A latch circuit device for a microcomputer having a normal state and a sleep state, comprising:
   a latch circuit latching an input signal to the microcomputer;
   a detection circuit detecting the input signal during the sleep state to output a detection signal;
   a wake-up circuit outputting a wake-up signal to the microcomputer in response to the detection signal;
   a sampling circuit having a sampling input to receive the input signal from the latch circuit;
   a transmission circuit having a transmission input to receive the input signal from the sampling circuit and to output the input signal to the microcomputer in response to the wake-up signal; and
   a release circuit outputting a latch release signal to the latch circuit upon the input signal being read to the microcomputer,
   wherein, in the normal state, the sampling circuit periodically receives a read request signal from the microcomputer and receives the input signal from the latch circuit in response to the read request signal, and the transmission circuit receives the input signal from the sampling circuit to output the input signal to the microcomputer.

2. The latch circuit device according to claim 1,
   wherein the transmission circuit converts a plurality of the input signals read from the latch circuit into a serial signal, and transmits the serial signal to the microcomputer via a serial communication line.

3. The latch circuit device according to claim 1,
   wherein the release circuit releases the latch state of the latch circuit when a release signal is received from the microcomputer that has received the input signal.

4. The latch circuit device according to claim 2,
   wherein the release circuit releases the latch state of the latch circuit when a release signal is received from the microcomputer that has received the input signal.

5. A port sampling system comprising:
   a microcomputer having a normal state and a sleep state; and
   a latch circuit device latching an input signal to the microcomputer and transmitting the latched signal to the microcomputer,
   wherein the microcomputer comprises:
      a control unit shifting the microcomputer to the normal state or the sleep state, and
      a reception receiving the input signal from the latch circuit device, and
   wherein the latch circuit device comprises:
      a latch circuit latching the input signal to the microcomputer;
      a detection circuit detecting the input signal during the sleep state;
      a wake-up circuit outputting a wake-up signal to the microcomputer in response to the detection signal;
      a sampling circuit having a sampling input to receive the input signal from the latch circuit;
      a transmission circuit having a transmission input to receive the input signal from the sampling circuit and to output the input signal to the microcomputer in response to the wake-up signal; and
      a release circuit outputting a latch release signal to the latch circuit upon input signal is-being read to the microcomputer,
   wherein, in the normal state, the sampling circuit periodically receives a read request signal from the microcomputer and receives the input signal from the latch circuit in response to the read request signal, and the transmission circuit receives the input signal from the sampling circuit to output the input signal to the microcomputer.

* * * * *